(12) United States Patent
Dinapoli et al.

(10) Patent No.: US 8,766,198 B2
(45) Date of Patent: Jul. 1, 2014

(54) SINGLE PHOTON COUNTING READOUT CHIP WITH NEGLIGIBLE DEAD TIME

(75) Inventors: Roberto Dinapoli, Brugg (CH); Beat Henrich, Basel (CH); Roland Horisberger, Kirchdorf (CH)

(73) Assignee: Paul Scherrer Institut, Villigen/PSI (CH)

( * ) Notice: Subject to any disclaimer, the term of this patent is extended or adjusted under 35 U.S.C. 154(b) by 0 days.

(21) Appl. No.: 13/575,349

(22) PCT Filed: Dec. 9, 2010

(86) PCT No.: PCT/EP2010/069265
§ 371 (c)(1),
(2), (4) Date: Aug. 14, 2012

(87) PCT Pub. No.: WO2011/091896
PCT Pub. Date: Aug. 4, 2011

(65) Prior Publication Data
US 2012/0298877 A1 Nov. 29, 2012

(30) Foreign Application Priority Data
Jan. 26, 2010 (EP) .................................... 10151685

(51) Int. Cl.
*G01T 1/24* (2006.01)
(52) U.S. Cl.
USPC .................................................. 250/370.01
(58) Field of Classification Search
USPC .................................................. 250/370.01
See application file for complete search history.

(56) References Cited

U.S. PATENT DOCUMENTS

| | | | |
|---|---|---|---|
| 5,475,225 A | 12/1995 | Stettner | |
| 5,665,959 A * | 9/1997 | Fossum et al. | 250/208.1 |
| 6,121,622 A * | 9/2000 | Beyne et al. | 250/374 |
| 6,154,165 A | 11/2000 | Gross, Jr. | |
| 6,248,990 B1 * | 6/2001 | Pyyhtia et al. | 250/208.1 |
| 6,362,482 B1 * | 3/2002 | Stettner et al. | 250/370.08 |
| 6,362,484 B1 * | 3/2002 | Beyne et al. | 250/374 |
| 6,552,319 B2 * | 4/2003 | Pyyhtia et al. | 250/208.1 |
| 6,552,745 B1 * | 4/2003 | Perner | 348/308 |
| 6,690,019 B2 * | 2/2004 | Stettner et al. | 250/370.08 |

(Continued)

FOREIGN PATENT DOCUMENTS

| | | |
|---|---|---|
| EP | 1 924 079 A2 | 5/2008 |
| WO | 2004/064168 A1 | 7/2004 |

*Primary Examiner* — David Porta
*Assistant Examiner* — Taeho Jo
(74) *Attorney, Agent, or Firm* — Laurence A. Greenberg; Werner H. Stemer; Ralph E. Locher

(57) ABSTRACT

A single photon counting pixel detector chip has a negligible dead time and consequentially high frame rates. The detector chip contains: a) a layer of photosensitive material; b) an N×M array of photo-detector diodes arranged in the layer of photosensitive material; and c) a N×M array of readout unit cells. The readout unit cell contains an input interface connected to a diode output interface, a high-gain charge to voltage amplifying device and a pixel counter being connected to an output of the high-gain voltage amplifying device. The pixel counter is split into a first number of nibble counters. The basic counter cell contains a counting element, a switch, a temporary storage element and an output stage. Additionally, the detector chip has a side shift register to read out the nibble counters row-wise with a predetermined number of nibble row selections.

8 Claims, 3 Drawing Sheets

(56) References Cited

U.S. PATENT DOCUMENTS

| | | |
|---|---|---|
| 7,514,688 B2 | 4/2009 | Broennimann et al. |
| 7,829,860 B2 * | 11/2010 | Nygard et al. ........... 250/370.09 |
| 8,023,026 B2 | 9/2011 | Nakajima |
| 8,159,379 B2 * | 4/2012 | Ritt et al. ...................... 341/122 |
| 8,395,127 B1 * | 3/2013 | Frach et al. .............. 250/370.11 |
| 2006/0071170 A1 * | 4/2006 | Broennimann et al. . 250/370.09 |
| 2008/0203309 A1 * | 8/2008 | Frach et al. ................... 250/362 |
| 2010/0116999 A1 * | 5/2010 | Tumer et al. ............. 250/370.13 |

\* cited by examiner

SINGLE PHOTON COUNTING READOUT CHIP WITH NEGLIGIBLE DEAD TIME

BACKGROUND OF THE INVENTION

1. Field of the Invention

The present invention relates to a new, very high frame rate, read out chip designed for single photon counting in combination with a separate semiconductor material for the photoelectric effect. This chip is the basic module for new detector systems for X-ray applications at synchrotrons or with lab equipment (lab diffractometers): material science, crystallography, non destructive testing and medical applications; energy range: 1-200 keV.

2. Current State of the Art (for Single Photon Counting)

Hybrid pixel detectors consist of a pixilated X-ray sensitive layer (silicon sensor) and a corresponding pixilated readout chip. Each pixel in the sensor is directly connected (bump bonding or flip chip bonding) to the corresponding pixel in the readout chip. A generic pixel detector is disclosed in the European Patent Application 1 581 971 A1.

The readout chip contains an array of n×m independently working channels (pixels). Each channel has a charge sensitive preamplifier with tunable gain, a signal shaper with tunable shaping time, a comparator and a counter with simple pixel control and readout logic. A photon impinging a sensor pixel generates electron-hole pairs. These electron-hole pairs are separated by an electric field generating a charge pulse. This charge signal from the sensor is amplified and filtered by the low noise preamplifier and shaper in the corresponding pixel cell (in the readout chip). The shaped signal is fed to a comparator with a global reference voltage and an on-pixel trim DAC. An incoming signal exceeding this threshold will toggle the comparator state. If the chip is in Expose mode (counting the photons), the comparator pulse increments the digital counter by one. During the Readout phase the pixel counter states are serially transferred to the chip periphery, where they are readout via dedicated readout logic.

The known state of the art according to the EP 1 581 971 A1 has several limitations for single photon counting:

i) A general problem of readout pixel chips is related to the pixel size. Known pixel detector have a pixel size in the range of about 172 $\mu m^2$. A smaller pixel size can increase the image resolution, but limits also the number of transistors, and hence the functionality, that can be put on the pixel itself. This is specifically the case for radiation hard designs where the transistors are larger as compared to standard transistors.

ii) For fast frame rates the readout time (dead time) is very significant and limits the frame rate. Many measurements are currently limited by the frame rate. The pixel detector known in the prior art having 256×256 pixels at a data depth of 12 bit requires at a read-out rate of 200 MHz about 4 to 6 ms for its readout.

iii) For pump and probe measurements a sample is excited (pumped) and then after a selectable time the counting is enabled for a short period (probe). This is then repeated as often as required to gain statistics, accumulating the images. Where the conditions are not constant it is necessary to make (at least) 2 simultaneous measurements (usually pumped and un-pumped). This is currently not possible since the counts can only be accumulated in one internal counter.

BRIEF SUMMARY OF THE INVENTION

It is therefore an objective of the present invention to provide a single photon counting pixel detector chip having a negligible dead time and consequentially high frame rates.

This objective is achieved according to the present invention by a single photon counting pixel detector chip, comprising:
a) a layer of photosensitive material;
b) an N×M array of photo-detector diodes arranged in said layer of photosensitive material; each of said photo-detector diodes having a diode output interface;
c) a N×M array of readout unit cells, one readout unit cell for each photo-detector diode;
d) said readout unit cell comprising:
  d1) an input interface connected to said diode output interface, a high-gain charge to voltage amplifying means and a pixel counter being connected to an output of the high-gain voltage amplifying means,
  d2) said pixel counter being split into a number of nibble counters, each nibble counter having an individual number of bits, wherein for each bit a basic counter cell is provided; said basic counter cell comprising a counting element, a switch, a temporary storage element and an output stage, wherein said basic counter cells are cascaded;
e) a side shift register to read out the nibble counters row-wise with a predetermined number of nibble row selections wherein the data stored in the temporary storage elements on the selected nibble counter row are sent on a parallel bus as currents and are transformed in digital levels by parallel bus receivers.

The present chip therefore enable to measure incident photons at high frame rates with almost no dead time for data readout. The temporary storage element enables to take the next image while the previous one is being readout. Due to the split of the pixel counter into a number of nibble counters for each pixel the chip further enables to readout at flexible bit depths according to the chosen dynamic range of the counter. Further, the crosstalk from digital to analogue signal lines is tremendously reduced: the readout takes place at lower signal rates due to the parallel readout in the range of the analogue pixel section and a faster serial readout data transfer at the digital sections in the periphery of the chip placed already enough apart from the sensitive analogue part.

In order to satisfy the demand of a smaller pixel size, a preferred embodiment of the present invention may comprise the temporary storage elements implemented as an array of capacitors wherein this array of capacitors is physically placed on top of the pixel counter. Since the counter consumes already about 75 to 80% of the pixel area, this option does not occupy more space due to the stacked arrangement of the array of capacitors.

In order to lower the readout time for the entity of the pixels, a further preferred embodiment of the present invention provides columns of a predetermined number of pixels grouped together to form a supercolumn; every supercolumn being independent from the other ones whereby the readout is carried out in parallel on the number of resulting supercolumns. Assuming for example a chip comprising 256×256 pixels a super column may comprise eight columns of pixel resulting in 32 super columns in total. Further assuming three nibble counters (NC) each four bits deep and a main clock at 100 MHz using Double Data Rate (DDR: 5 ns/bit), the time needed to readout each of the three rows of the super column is (4 bits/NC*8 columns*5 ns=160 ns. This means that the side shift register (SSR) has to be clocked at 1/160 ns=6.25 MHz which is rather low as compared to higher clock rates at the farer end of the serialization of readout data. The outputs of the bus receivers are being stored for each super column in a receiving latch and serialized at a higher speed as compared to the speed of readout of a super column. Using a column selection circuitry that needs to present the nibble counter output at the input of a super serializer downstream in the signal path every 20 ns, the frequency of the respective clock is at maximum at 25 MHz wherein this chip zone is already rather far from the sensitive analogue pixel array.

Further, in order to improve the robustness against crosstalk from digital signal line to analogue signal lines, the array of readout unit cells may feature a triple well design placing P transistors and N transistors on separate substrates which are not shared with other transistors. Furthermore, three substrate zones may correspond to four separate power domains, wherein a charge amplifier transistor and I/O drivers are disposed on two completely separate substrate zones and power domains. Last but not least, a further option may provide the digital signal lines crossing analog pixel sections being shielded in order to minimize the coupling with the neighboring circuitry.

When additionally using low-voltage differential signals (LVDS) for the master clock and the EXPOSE signal (acquisition of data) this measure also contributes in reducing the crosstalk at the chip and printed circuit board level.

Further, global signals are generated with special care. Advantageously, global signals are generated in a manner to avoid crosstalk, wherein pixel counter RESET, STORE and EXPOSE signals occur as general signals; said RESET signal being distributed on a column base and being refreshed after a predetermined number of rows; said STORE signal causing an extra power consumption to copy the content of all bits into the respective temporary storage elements thereby biasing the switch in order to limit the maximum current flow through it; and said EXPOSE signal generate a high peak current substantially due to a short circuit current flowing from VDD to Ground during switching in a AND gate after a comparator wherein in the periphery of the chip a circuitry generates from a resulting ENABLE signal a two-phases signal which drives a P side and a N side of the readout unit cells in different time windows. Again, these measures contribute in reducing the crosstalk.

Preferred embodiments of the present invention are hereinafter explained in more detail with reference to the attached drawings.

DESCRIPTION OF THE INVENTION

The following description explains an innovative single photon counting pixel detectors targeting problems enumerated above, i.e. a system which has a negligible dead time and a high frame rate combined with a small pixel size. With reference to the general design of the chip comprising photodetector diodes and low noise high gain amplification means, reference is made to the European Patent Application EP 1 581 971 A1 which is incorporated herewith by reference.

The above problems are addressed in four ways:

1a) Storage of the pixel counter on a temporary buffer;
1b) Implementation of the temporary buffer as an array of capacitors;
2) Selectable pixel counter depth (4, 8 or 12 bit); and
3) Massively parallel readout.

1a+1b) Storage of the Pixel Counter on a Temporary Buffer (Continuous Read/Write) Implemented as an Array of Capacitors To reduce to a very minimum the dead time between frames the chip features double buffered storage, so a next image can already be taken while the previous one is being readout (i.e. Expose and Readout phases can happen at the same time). This requires the storage of the pixel counters on a temporary buffer, so that counters can be reset to immediately allow a new exposure. A standard design approach would be to copy the counter content into a set of latches, or to have two independent counters per pixel. Because 75 to 80% of the pixel area is already consumed by the counters, this approach would make the required area about 1.8 times higher than needed, conflicting with the requirement for a smaller pixel size.

Figure 1:
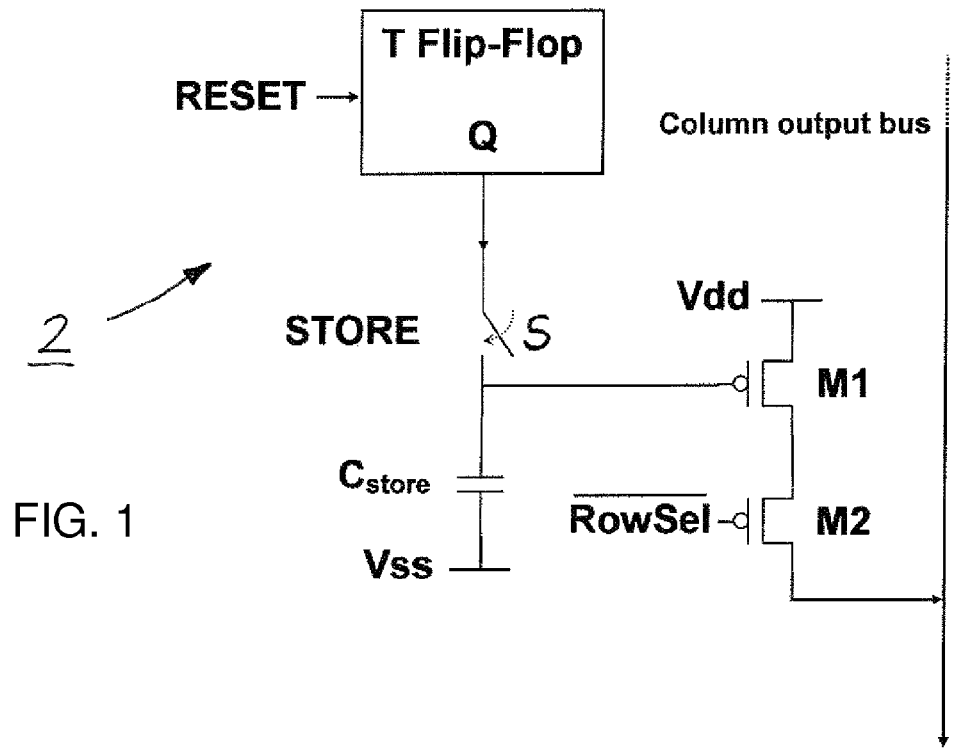
FIG. 1 illustrated a sketch of a basic counter cell (with readout circuitry) of a pixel counter chip.

The novel idea consists in using an array of capacitors as temporary buffer which store the digital information as an analog value. A big advantage of this structure is its simplicity shown in FIG. 1: per bit only a switch S and one capacitor $C_{store}$ are required. FIG. 1 is illustrating a basic counter cell 2, comprising a counting element T-Flip flop having an output Q, the capacitor $C_{store}$ as temporary storage element and output stage (M1-M2). The pixel counter 4 (FIG. 2) for each pixel is composed by 12 such cascaded basic counter cells 2. Moreover, as this array of capacitors $C_{store}$ can be physically placed on top of the pixel counter 4, they do not occupy more space, allowing a much smaller pixel size. The pixel of the current chip is actually in the range of $75^2$ µm$^2$, compared with a range of $100^2$ µm$^2$ a double counter approach would require. This approach reduces the dead time to a minimum of less than 1 µs, needed to disable the pixel counters, perform the buffering, reset, and finally re-enable the pixel counters again.

Because of the volatile character of the analogue storage, the readout has to occur before the capacitor $C_{store}$ discharges. The time for which the information is stored correctly on the capacitor $C_{store}$ was measured to be more than 1 ms at ambient temperature. This has to be compared with the 121 µs needed to readout the chip in the worst case (i.e. in 12 bits, see section 2). Nevertheless, the chip features also a "safe" mode of operation, which allows operation with sequential Expose/Readout phases.

2) Selectable Pixel Counter Depth (4, 8 or 12 Bit)

Figure 2:
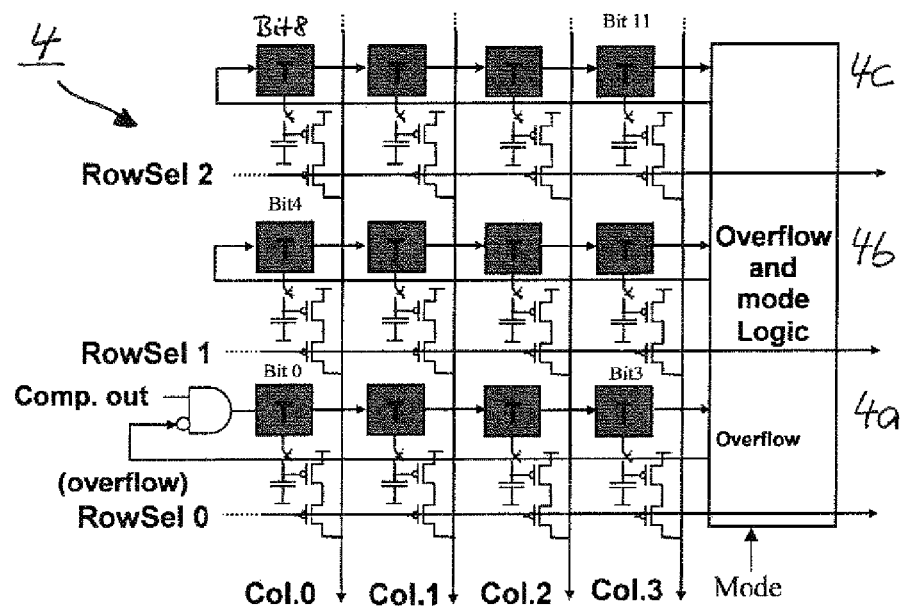
FIG. 2 shows a block diagram of the pixel counter and the pixel control logic.

FIG. 2 shows the block diagram of the pixel counter 4 and the pixel control logic. The pixel counter 4 is composed by three sub-counters 4a to 4c of four bits each, which can be chained and controlled to form a pixel counter 4 which can be selected to be 4 (Bit0 to Bit3), 8 (Bit0 to Bit7) or 12 bit (Bit0 to Bit11) deep. This results in a dynamic range of 15, 255 and 4095 counts, respectively. An overflow logic receives as an input the chip mode (Mode) and the state of the sub-counters 4a to 4c. To inhibit wrap-around the pixel counter 4 is frozen in a reserved "overflow" state if the dynamic range is exceeded.

The time needed to readout the chip in 12 bit mode is 121 µs (see section 3 hereinafter). The chip gives the user the possibility to trade off dynamic range with frame rate speed. By setting the actual pixel counter depth to 8 or 4 bits readout times of 81 µs, and 41 µs respectively, can be achieved.

3) Highly Parallel Readout

One of the main problems to be kept under control in such mixed mode designs where an extremely sensitive analog section is placed next to a noisy digital section is digital to analog crosstalk. On the other hand, the only way to obtain the extremely high frame rate the system is targeting is to implement a very fast and highly parallel information transfer scheme. Both the high frequency signals (high speed) and the high switching activity (high parallelism) can interfere with the analogue signals of the high gain-low noise analog amplifiers. In this design parallelism and speed have carefully been chosen to obtain the maximum performance and the minimum crosstalk for the chip.

Figure 3:
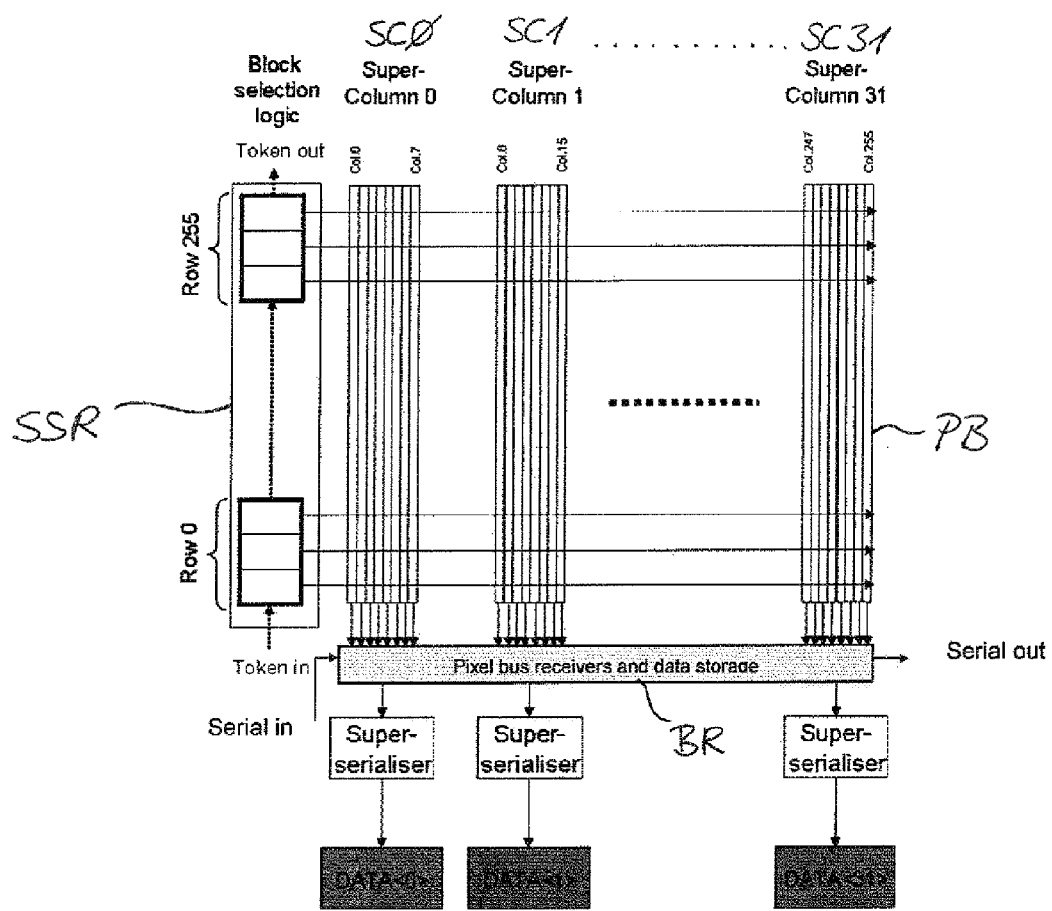
FIG. 3 depicts the pixel counter chip top level architecture and floor-planning.

The main cross talk mechanisms are coupling through the substrate of the silicon CMOS chip, through the power supply or through direct crosstalk between digital and analogue signal lines. The following measures are, therefore, implemented to minimize the cross talk.

i) Separate substrate for the input transistor (decouples the input of the preamp from the rest of the substrate)
  ii) Separate power supply domains for analogue and digital part of the pixel and for the Input/Output circuitry (pads)
  iii) Separate substrate for the Input/Output (I/O) circuitry (to reduce the usually big crosstalk of the I/O pads to the substrate)
  iv) Shielding of digital lines which cross the analog section and starving of the signals carried by these lines
  v) LVDS input for the 100 MHz frequency master clock and for the EXPOSE signal.
  vi) In the active area (the pixel array) the digital data lines are highly parallel to obtain a low switching frequency (6.25 MHz). In addition this allows slowing down the digital control signals (to starve them). The high frequencies are only used away from the active region in the periphery of the chip driving the I/O pads to achieve the needed high data transfer rates. These measures significantly reduce the cross talk to the analogue sections of the pixel matrix.
  vii) In addition the data is read out in current mode which causes a low voltage swing reducing further the crosstalk during readout.
  viii) Careful generation and distribution of "global" control signals In the following the above points are explained in more detail. FIG. 3 shows the chip top level architecture and floor planning. It was conceived based on point vi)-vii).

The idea consists in having fast signals only at the chip periphery, and slower and slower signals approaching the chip sensitive area. At the same time, the parallelism is increased and additional care is taken to avoid crosstalk due to high levels of switching activity.

As already explained, the 12 bit pixel counter 4 is split in three Nibble Counters (NCs) 4a to 4c, so a nibble row is formed by 256 NCs (1024 bits). The readout, based on a row-shift register (called Side Shift Register: SSR), is also carried out nibble-wise. A one (logical high) is fed in at the first cell of the SSR at the beginning of the readout cycle, and is then clocked through the register. The nibble row which corresponds to the SSR cell carrying the one is said to be "selected", and sends data stored in the on-pixel temporary storage capacitor $C_{store}$ to the output readout circuitry.

Depending on the mode of operation, i.e. on the number of active NCs, a pixel row readout can consist of 1, 2 or 3 nibble row selections, which results in 256, 512 or 768 nibble row selections for a complete frame readout in 4, 8 and 12 bit mode, respectively. The SSR is thus equipped with some additional control circuitry which allows skipping one or two nibble selections, in 8 and 4 bit mode respectively, to perform a correspondingly faster readout.

Data stored on the selected NC row are sent on a parallel bus PB as currents, and transformed in digital levels by the array of 256×4 current comparators which act as bus receivers BR. This reduces the voltage swing on the long digital busses PB from 2V to ~70 mV, reducing this way the impact of the big analog to digital crosstalk generated by 1024 digital lines (PB) crossing the whole chip which switch simultaneously (point vii).

Figure 4:
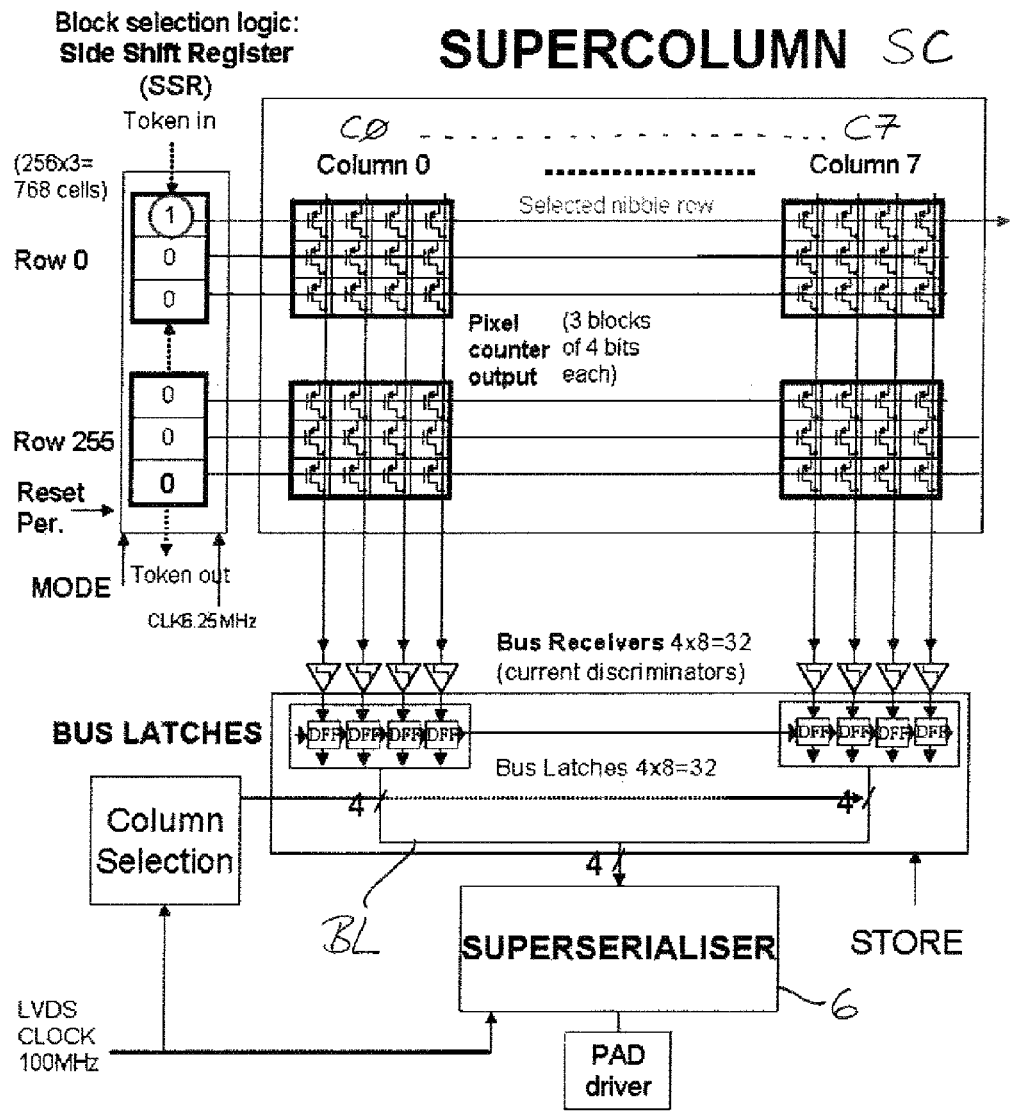
FIG. 4 illustrates the design of columns, each comprising eight pixels that are grouped together to form a unit called hereinafter "supercolumn".

Columns C0 to C7 of 8 pixels are grouped together to form a unit called "super column" SC, SC0 to SC31. In normal operation, every supercolumn SC is completely independent from the other ones, so that the complete chip readout can be carried out in parallel on the 32 resulting supercolumns SC0 to SC31. FIG. 4 shows a more detailed view of a supercolumn SC and of its functionality.

The output of the bus receivers BR (i.e. the content of the NCs) of each super column SC are then stored in a receiving 32-bit latch BL and serialized at high speed by some dedicated circuitry (superserializer 6). As the main clock is 100 MHz (10 ns) and Double Data Rate (DDR: 5 ns/bit) is used, the time needed to readout each row of a super column SC is (4 bits/block)*8 columns*5 ns=160 ns. This means that the SSR has to be clocked at 1/160 ns=6.25 MHz. This is also the frequency at which the bus receiver BR outputs have to be stored in the receiving latches BL. As it can be seen, the maximum frequency of digital signals generated or received by blocks which are very close to the sensitive pixel array is 6.25 MHz (point vi).

A column selection circuitry is responsible for selecting the nibble to be presented at the input of the superserializer 6 every 20 ns. This means that this block, which is now at some distance from the pixel array, generates signals at a maximum frequency of 25 MHz. At the end of the chain, far from pixels and very close to the output pad, the superserializer 6 serializes the four bits of every NC in pulses which are 5 ns long.

The chip was designed with a special care in layout, to minimize digital to analog crosstalk (point i to iv). The technology used has the "triple well" feature, so that not only P-transistors, but also N-transistors can be placed on a separate substrate, which is not shared with other transistors. Three separate substrate zones are comprised, corresponding to 4 separate power domains. The charge amplifier transistors, as well as the I/O drivers, are on two completely separate substrates and power domains. The shaper and the pixel logic are connected to two separate power domains, but their transistors share the same substrate.

Special care was also taken for digital signals crossing the analog pixel section. These signals are actively slowed down (starving) and the signals lines are shielded to have minimum coupling with the neighboring circuitry. Moreover, the use of LVDS signals for the master clock and the EXPOSE signal contribute in reducing the crosstalk at the chip and printed circuit board level.

The global signals (pixel counters RESET, STORE and EXPOSE) are generated with special care. In fact, they have to drive all the pixels (or even all the chip bits) at the same time, and this could cause very high crosstalk and even chip malfunctioning/failure.

The RESET is distributed on a column base, and is refreshed every second row with weak drivers. This generates a "switching domino wave" which distributes as evenly as possible the extra power consumption generated by the reset both in space and, most of all, in time. Moreover, the signal is widened to >100 ns, to be sure that the wave started by the positive edge is over before the wave started by the negative edge is taking place.

During the STORE phase the content of all 256×256×12 bits is copied in the capacitor array for temporary storage. In this case the extra power consumption could also corrupt the counter content. To prevent this, the switch S (see FIG. 1) is designed and biased so that it limits the maximum current flow through it.

Setting and clearing the EXPOSE signal generates also a high peak current, which is mostly due to a short circuit current flowing from Vdd to Ground during switching in the AND gate after the comparator (see FIG. 2). To avoid this, special circuitry in the chip periphery generates from the incoming ENABLE pulses a 2-phases signal which drives the P and N side of the pixel circuitry in different time windows, so that no short circuit path Vdd-GND is present at any time.

Several testing and debugging features are also present.
  i) Every pixel can be individually addressed for assessing its functionality, even without a bump-bonded sensor.
  ii) The output of the pixel under test is presented on a dedicated output, to be able to verify its analog performance.
  iii) The complete set of 32 parallel superserializers 6 can be bypassed, and the whole chip can be readout on a single, completely serial, output (Serial out in FIG. 3).
  iv) In "synchronization mode" a preloaded pattern can be read out continuously such that the chip behaves like a DDRII RAM. This is useful for synchronization with the external control circuitry.

SUMMARY OF THE FEATURES

Summarizing the features allowing to increase the frame rate or to improve the system design:
  Selectable counter depth (4, 8 and 12 bits).
  Storage of the pixel counter on a temporary buffer (Continuous Read/Write) implemented as an array of capacitors.
  "Slow speed", highly parallel internal readout (6.25 MHz, 1024 bus lines); higher speed, "superserialised" external readout, based on the supercolumn architecture, still keeping a high parallel data transfer to the control board (100 MHz DDR, 32 data lines).
  Extremely careful layout for digital to analog crosstalk minimization: use of triple wells, separate power domains, shielding and starving of digital lines crossing the pixel analog section, special care for global signals generation and distribution, use of LVDS signals where possible.
  High level of testability: every pixel can be individually addressed for testing and visualization of its analog output, special chip state available for I/O synchronization, completely serial readout mode on a dedicate output also available.

The invention claimed is:

1. A single photon counting pixel detector chip, comprising:
  a layer of photosensitive material;
  an N×M array of photo-detector diodes disposed in said layer of photosensitive material, each of said photo-detector diodes having a diode output interface;
  a N×M array of readout unit cells, one of said readout unit cells being provided for each of said photo-detector diodes, each of said readout unit cells containing:
    an input interface connected to one of said diode output interfaces;
    a high-gain charge to voltage amplifying means having an output;
    a pixel counter connected to said output of said high-gain voltage amplifying means, said pixel counter being split into a first number of nibble counters, each of said nibble counters having an individual number of bits, wherein for each of said bits, said nibble counters have a basic counter cell, said basic counter cell containing a counting element, a switch, a temporary storage element and an output stage, wherein said basic counter cells are cascaded, said temporary storage elements being implemented as an array of capacitors wherein said array of capacitors is physically placed on top of said pixel counter; and
  a side shift register to read out said nibble counters row-wise with a predetermined number of nibble row selections wherein data stored in said temporary storage elements on a selected nibble counter row are sent on a parallel bus as currents and are transformed into digital levels by parallel bus receivers.

2. The single photon counting pixel detector chip according to claim 1, wherein columns of a predetermined number of pixels are grouped together to form a supercolumn, every said supercolumn being independent from other ones whereby a readout is carried out in parallel on a number of resulting said supercolumns.

3. The single photon counting pixel detector chip according to claim 2, wherein an output of said bus receivers are stored for each said supercolumn in a receiving latch and serialized at a higher speed as compared to a speed of readout of said supercolumn.

4. The single photon counting pixel detector chip according to claim 1, further comprising digital signal lines crossing analog pixel sections being shielded and corresponding drivers are delayed.

5. The single photon counting pixel detector chip according to claim 1, wherein low-voltage differential signals are used for a master clock.

6. A single photon counting pixel detector chip, comprising:
  a layer of photosensitive material;
  an N×M array of photo-detector diodes disposed in said layer of photosensitive material, each of said photo-detector diodes having a diode output interface;
  a N×M array of readout unit cells, one of said readout unit cells being provided for each of said photo-detector diodes, each of said readout unit cells containing:
    an input interface connected to one of said diode output interfaces;
    a high-gain charge to voltage amplifying means having an output;
    a pixel counter connected to said output of said high-gain voltage amplifying means, said pixel counter being split into a first number of nibble counters, each of said nibble counters having an individual number of bits, wherein for each of said bits, said nibble counters have a basic counter cell, said basic counter cell containing a counting element, a switch, a temporary storage element and an output stage, wherein said basic counter cells are cascaded;
  a side shift register to read out said nibble counters row-wise with a predetermined number of nibble row selections wherein data stored in said temporary storage elements on a selected nibble counter row are sent on a parallel bus as currents and are transformed into digital levels by parallel bus receivers; and said N×M array of readout unit cells having a triple well design with separate substrates and disposing P transistors and N transistors on said separate substrates which are not shared with other transistors.

7. The single photon counting pixel detector chip according to claim 6, further comprising:
   three substrate zones corresponding to four separate power domains; and
   a charge amplifier transistor and I/O drivers disposed on two completely separate said substrate zones and said power domains.

8. A single photon counting pixel detector chip, comprising:
   a layer of photosensitive material;
   an N×M array of photo-detector diodes disposed in said layer of photosensitive material, each of said photo-detector diodes having a diode output interface;
   a N×M array of readout unit cells, one of said readout unit cells being provided for each of said photo-detector diodes, each of said readout unit cells containing:
      an input interface connected to one of said diode output interfaces:
      a high-gain charge to voltage amplifying means having an output;
      a pixel counter connected to said output of said high-gain voltage amplifying means, said pixel counter being split into a first number of nibble counters, each of said nibble counters having an individual number of bits, wherein for each of said bits, said nibble counters have a basic counter cell, said basic counter cell containing a counting element, a switch, a temporary storage element and an output stage, wherein said basic counter cells are cascaded;
   a side shift register to read out said nibble counters row-wise with a predetermined number of nibble row selections wherein data stored in said temporary storage elements on a selected nibble counter row are sent on a parallel bus as currents and are transformed into digital levels by parallel bus receivers; and
   wherein global signals are generated in a manner to avoid crosstalk, wherein pixel counter RESET, STORE and EXPOSE signals occur as general signals; the RESET signal being distributed on a column base and being refreshed after a predetermined number of rows; the STORE signal causing an extra power consumption to copy content of all bits into said respective temporary storage elements thereby biasing said switch in order to limit a maximum current flow through said switch; and the EXPOSE signal generating a high peak current substantially due to a short circuit current flowing from VDD to Ground during switching in an AND gate after a comparator wherein in a periphery of the chip a circuitry generates from a resulting ENABLE signal a two-phases signal which drives a P side and a N side of the readout unit cells in different time windows.

\* \* \* \* \*